United States Patent
Seo et al.

(10) Patent No.: US 11,025,203 B2
(45) Date of Patent: *Jun. 1, 2021

(54) COMMUNICATION DEVICE AND OPERATING METHOD THEREOF

(71) Applicant: SOLiD, INC., Gyeonggi-do (KR)

(72) Inventors: Kwangnam Seo, Gyeonggi-do (KR); Doyoon Kim, Gyeonggi-do (KR); Hyoungho Kim, Seoul (KR); Daesung Baek, Seoul (KR)

(73) Assignee: SOLiD, INC., Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/944,453

(22) Filed: Jul. 31, 2020

(65) Prior Publication Data

US 2020/0366254 A1    Nov. 19, 2020

Related U.S. Application Data

(63) Continuation-in-part of application No. 16/711,705, filed on Dec. 12, 2019, now Pat. No. 10,763,795, (Continued)

(30) Foreign Application Priority Data

Feb. 15, 2016  (KR) .......................... 10-2016-0017055

(51) Int. Cl.
    *H04B 1/04*       (2006.01)
    *H03F 1/32*       (2006.01)
    (Continued)

(52) U.S. Cl.
    CPC .............. *H03F 1/3247* (2013.01); *H03F 3/19* (2013.01); *H03F 3/245* (2013.01); *H04B 1/0475* (2013.01);
    (Continued)

(58) Field of Classification Search
    CPC ...... H03F 1/3247; H03F 1/3241; H03F 1/025; H03F 1/0277; H03F 3/211;
    (Continued)

(56) References Cited

U.S. PATENT DOCUMENTS 6,751,447 B1    6/2004 Jin et al.
8,218,678 B2    7/2012 Kim
(Continued)

FOREIGN PATENT DOCUMENTS

KR    10-2001-0062808 A    7/2001

OTHER PUBLICATIONS

Korean Notice to Submit Response issued in KR 10-2016-0017055 dated Dec. 6, 2016.
(Continued)

*Primary Examiner* — Rahel Guarino
(74) *Attorney, Agent, or Firm* — Sughrue Mion, PLLC

(57) ABSTRACT

The inventive concept relates to a communication device comprising a DPD processor configured to output a plurality of pre-distorted signals by pre-distorting each of a plurality of input signals using an extracted feedback signal, a first signal combiner configured to combine a plurality of feedback signals corresponding to the plurality of pre-distorted signals and output a combined feedback signal, an analog-to-digital converter configured to convert the combined feedback signal into a digital signal and output a digital-converted combined feedback signal and a signal extractor configured to extract the digital-converted combined feedback signal and output the extracted feedback signal.

17 Claims, 6 Drawing Sheets

Related U.S. Application Data which is a continuation of application No. 16/077,917, filed as application No. PCT/KR2016/003144 on Mar. 28, 2016, now Pat. No. 10,536,120.

(51) Int. Cl.
  *H04L 25/03* (2006.01)
  *H03F 3/19* (2006.01)
  *H03F 3/24* (2006.01)

(52) U.S. Cl.
  CPC .. *H04L 25/03343* (2013.01); *H03F 2200/129* (2013.01); *H03F 2200/372* (2013.01); *H03F 2200/451* (2013.01); *H04B 2001/0425* (2013.01)

(58) Field of Classification Search
  CPC ......... H03F 2200/387; H03F 2200/408; H03F 2200/411; H03F 2200/129; H03F 1/3252; H03F 3/2175; H03F 3/2178; H03F 2203/21106; H03F 3/19; H03F 3/245; H03F 2200/372; H03F 2200/451; H04L 27/367; H04L 25/03343; H04B 2001/0425; H04B 1/0483; H04B 2001/0433; H04B 17/24; H04B 1/0475; H03M 1/00

See application file for complete search history.

(56) References Cited

U.S. PATENT DOCUMENTS

| | | | |
|---|---|---|---|
| 8,477,871 B2* | 7/2013 | Neumann | H03F 3/68 375/296 |
| 8,803,603 B2 | 8/2014 | Wimpenny | |
| 8,837,620 B2 | 9/2014 | Ho et al. | |
| 8,948,301 B2 | 2/2015 | Rollins | |
| 10,536,120 B2* | 1/2020 | Seo | H03F 1/3247 |
| 10,763,795 B2* | 9/2020 | Seo | H03F 1/3247 |
| 2012/0083229 A1 | 4/2012 | Kenington | |
| 2014/0176224 A1 | 6/2014 | Winiecki et al. | |
| 2014/0347126 A1* | 11/2014 | Laporte | H03F 3/24 330/149 |
| 2015/0049841 A1* | 2/2015 | Laporte | H03F 1/34 375/297 |

OTHER PUBLICATIONS

Notice of Allowance issued in prior U.S. Appl. No. 16/077,917 dated Sep. 5, 2019.
International Search Report of PCT/KR2016/003144 dated Nov. 7, 2016.
Office Action issued in prior U.S. Appl. No. 16/077,917 dated Dec. 31, 2018.
Non-Final Office Action issued in parent U.S. Appl. No. 16/711,705 dated Jan. 21, 2020.
Notice of Allowance issued in parent U.S. Appl. No. 16/711,705 dated Apr. 29, 2020.

* cited by examiner

COMMUNICATION DEVICE AND OPERATING METHOD THEREOF

CROSS-REFERENCE TO RELATED APPLICATIONS

This is a Continuation-In-Part Application of U.S. application Ser. No. 16/711,705 filed on Dec. 12, 2019, which is a continuation of U.S. application Ser. No. 16/077,917 filed on Aug. 14, 2018 (now U.S. Pat. No. 10,536,120), which is a National Stage of PCT International Application No. PCT/KR2016/003144, filed Mar. 28, 2016, and claims priority from Korean Patent Application No. 10-2016-0017055, filed Feb. 15, 2016, the contents of which are incorporated herein by reference in their entireties.

BACKGROUND

1. Field

The present invention relates to a communication device for DPD (Digital Pre-Distortion) processing, and more particularly, to a communication device for sharing a feedback path for digital pre-distortion.

2. Description of the Related Art

A digital pre-distortion (DPD) power amplifier (hereinafter referred to as a DPD power amplifier) included in a communication device such as a repeater is intended to improve a nonlinear characteristic of a power amplifier and to pre-distort a digital signal before amplifying the digital signal so that input and output are kept linear. The DPD power amplifier for a single path includes a digital up-converter, a peak to average power ratio (PAPR) controller, a DPD processor, a digital to analog converter (DAC), an amplifier, a coupler, a DPD feedback path, and the like. An operation of the DPD power amplifier for a single path will be briefly described later below.

A baseband digital signal input to the DPD power amplifier is up-converted to a radio frequency (RF) band signal by the digital up-converter, and the RF band digital signal has a low PAPR by the PAPR controller. The digital signal is pre-distorted by the DPD processor, converted into an analog signal by the DAC, and amplified by the amplifier. The signal amplified by the amplifier is band-filtered by a band-pass filter and then transmitted through an antenna. Furthermore, the signal amplified by the amplifier is partially extracted by the coupler, and the extracted signal is provided to the DPD processor through the DPD feedback path. In addition, the DPD processor performs pre-distortion according to an output of the amplifier provided through the DPD feedback path.

Meanwhile, when the communication device has a plurality of transmission paths, the DPD power amplifier includes an independent DPD feedback path for each transmission path. That is, a multi-path communication device (a communication device capable of processing a plurality of signals having different frequency bands, such as a multi-antenna communication device and/or a multi-band communication device) includes DPD feedback paths corresponding to the number of transmission paths to process a plurality of signals having different frequency bands. However, each of the DPD feedback paths includes many components such as a mixer, an analog to digital converter (ADC), and a filter, thereby causing an increase in the size of a communication device and manufacturing cost thereof.

Accordingly, there is a need for an alternative that can solve an increase in the size of a device and manufacturing cost thereof caused by a plurality of DPD feedback paths in the multi-path communication device using the DPD power amplifier.

SUMMARY

Provided are a communication device for sharing a feedback path for digital pre-distortion.

According to an aspect of the present invention, a communication device may comprise a DPD processor configured to output a plurality of pre-distorted signals by pre-distorting each of a plurality of input signals using an extracted feedback signal, a first signal combiner configured to combine a plurality of feedback signals corresponding to the plurality of pre-distorted signals and output a combined feedback signal, an analog-to-digital converter configured to convert the combined feedback signal into a digital signal and output a digital-converted combined feedback signal and a signal extractor configured to extract the digital-converted combined feedback signal and output the extracted feedback signal.

According to an example embodiment, the extracted feedback signal may include a feedback signal for input signals of at least two different frequency bands among the plurality of input signals.

According to an example embodiment, the signal extractor may extract the digital-converted combined feedback signal and outputs the extracted feedback signal to the DPD processor.

According to an example embodiment, the communication device may further comprise a plurality of digital-to-analog converters, each of which converts each of the plurality of pre-distorted signals output from the DPD processor into an analog signal and outputs the analog signal.

According to an example embodiment, the communication device may further comprise a second signal combiner configured to combine and output at least some of the plurality of pre-distorted signals that are analog-converted and output from the plurality of digital-to-analog converters.

According to an example embodiment, the communication device may further comprise a plurality of power amplifiers, each of which amplifies each of a plurality of pre-distorted signals output by combining at least some of the plurality of pre-distorted signals from the second signal combiner and outputs each of a plurality of amplified signals.

According to an example embodiment, the communication device may further comprise a plurality of couplers, each of which outputs each of the plurality of feedback signals generated by coupling some of the plurality of amplified signals respectively output from the plurality of power amplifiers to the first signal combiner.

According to an example embodiment, the number of the plurality of power amplifiers and the number of the plurality of couplers may be the same, and the number of the plurality of power amplifiers is less than the number of the plurality of digital-to-analog converters.

According to an example embodiment, the communication device may further comprise a frequency converter configured to convert frequencies of at least some of the plurality of feedback signals input to the first signal combiner.

According to an example embodiment, the frequency converter may convert the frequencies of at least some of the plurality of feedback signals such that respective frequency bands of the plurality of feedback signals do not overlap each other.

According to an aspect of the present invention, a method of operating a communication device including a memory and a processor, may comprise outputting a plurality of pre-distorted signals by pre-distorting each of a plurality of input signals using an extracted feedback signal, combining a plurality of feedback signals corresponding to the plurality of pre-distorted signals and outputting a combined feedback signal, converting the combined feedback signal into a digital signal and outputting a digital-converted combined feedback signal and extracting the digital-converted combined feedback signal and outputting the extracted feedback signal.

According to an aspect of the present invention, a communication device may comprise a DPD processor configured to output a plurality of pre-distorted signals by pre-distorting each of a plurality of input signals using an extracted feedback signal, a digital signal combiner configured to digital-combining and outputting the plurality of pre-distorted signals, an analog-to-digital converter configured to convert at least one analog feedback signal corresponding to a digital-combined and output pre-distorted signal into a digital signal and output a digital-converted feedback signal and a signal extractor configured to extract at least a portion of the digital-converted feedback signal and output the extracted feedback signal.

According to an example embodiment, a communication device may further comprise an analog signal combiner configured to combine the analog feedback signals corresponding to the digital-combined and output pre-distorted signal and output a combined feedback signal, and the analog-to-digital converter converts the combined feedback signal into a digital signal and outputs the digital-converted feedback signal.

According to an example embodiment, the digital signal combiner digitally sums the plurality of pre-distorted signals to output a digitally summed pre-distorted signal.

According to an example embodiment, a communication device may further comprise a digital-to-analog converter configured to convert the digitally summed pre-distorted signal into an analog signal and output the analog signal.

According to an example embodiment, the digital signal combiner may be included in the digital-to-analog converter.

According to an example embodiment, a communication device may further comprise a plurality of analog filters, each of which extracts a pre-distorted signal that is analog-converted and output from the digital-to-analog converter for each frequency band, a plurality of power amplifiers, each of which amplifies each of the pre-distorted signals extracted for each frequency band and outputs each of the amplified signals and a plurality of couplers, each of which outputs an analog feedback signal corresponding to the pre-distorted signal generated by coupling a portion of each of the plurality of amplification signals to the analog signal combiner.

DETAILED DESCRIPTION OF EXEMPLARY EMBODIMENTS

Figure 1:
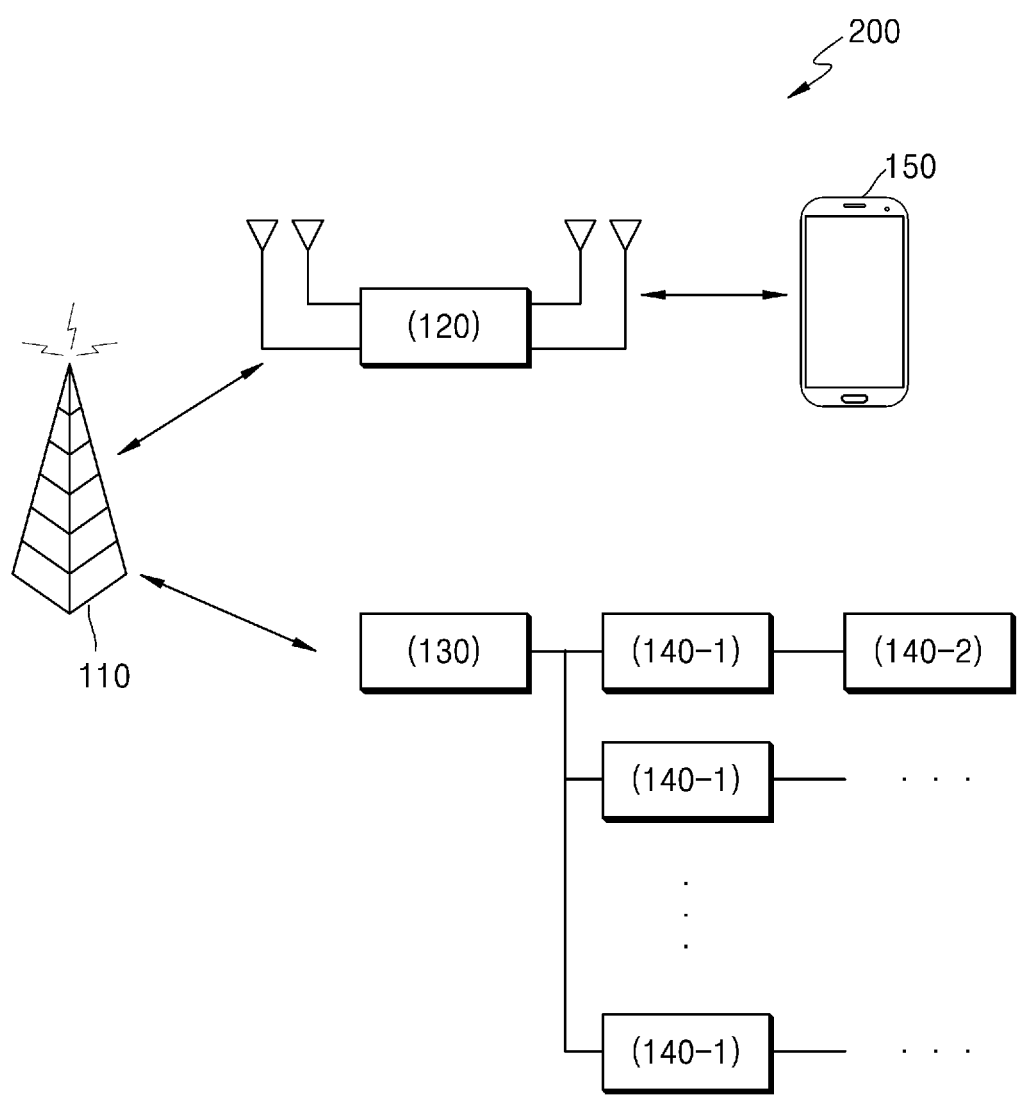
FIG. 1 is a configuration diagram of a communication system according to an embodiment of the present invention.

The inventive concept may be variously modified and have various embodiments, so that specific embodiments will be illustrated in the drawings and described in the detailed description. However, this does not limit the inventive concept to specific embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the present disclosure. In addition, numeral figures (e.g., 1, 2, and the like) used during describing the specification are just identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

In addition, terms including "unit," "er," "or," "module," and the like disclosed in the specification mean a unit that processes at least one function or operation and this may be implemented by hardware or software such as a processor, a micro processor, a micro controller, a central processing unit (CPU), a graphics processing unit (GPU), an accelerated Processing unit (APU), a digital signal processor (DSP), an application specific integrated circuit (ASIC), and a field programmable gate array (FPGA) or a combination of hardware and software. Furthermore, the terms may be implemented in a form coupled to a memory that stores data necessary for processing at least one function or operation.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

FIG. 1 is a configuration diagram of a communication system 100 according to an embodiment of the present invention.

Referring to FIG. 1, the communication system 100 according to an embodiment of the present invention may include a base station 110, which is a multi-path communication device using a DPD power amplifier, a wireless repeater 120, a head-end unit 130, remote units 140-1, 140-2, . . . , 140-n (where n is a natural number) (hereinafter, the head-end unit 130 and the remote unit 140-n are referred to as a distributed antenna system), and a mobile communication terminal 150.

Communication devices (the base station 110, the wireless repeater 120, and the distributed antenna systems 130 and 140-n) may connect a mobile communication network to the mobile communication terminal 150 for a mobile communication service. That is, a signal transmitted from the mobile communication terminal 150 may be amplified by the wireless repeater 120 or the distributed antenna systems 130 and 140-n and then transmitted to a receiving side (e.g., a receiver terminal (not shown)) via the base station 110. Furthermore, a signal transmitted from a transmitting side (e.g., a transmitter terminal (not shown)) may be amplified by the wireless repeater 120 or the distributed antenna systems 130 and 140-n via the base station 110 and then transmitted to the mobile communication terminal 150. That is, when a distance between the base station 110 and the mobile communication terminal 150 is too long to smoothly transmit signals, the wireless repeater 120 or the distributed antenna systems 130 and 140-n may perform signal amplification between the base station 110 and the mobile communication terminal 150.

The wireless repeater 120 and the distributed antenna systems 130 and 140-n may be implemented as a communication device supporting a multi-path in relaying signals between the base station 110 and the mobile communication terminal 150. For example, the communication devices (the base station 110, the wireless repeater 120, and the distributed antenna systems 130 and 140-n) may be implemented as a multiple-input multiple-output (MiMO) communication device having a plurality of reception antennas or reception ports and a plurality of transmission antennas or transmission ports to transmit signals through a multi-path. The communication devices (the base station 110, the wireless repeater 120, and the distributed antenna systems 130 and 140-n) may be implemented as a multi-band communication device capable of transmitting a plurality of frequency bands through a multi-path.

The communication devices (the base station 110, the wireless repeater 120, and the distributed antenna systems 130 and 140-n) may include a DPD power amplifier for pre-distorting a signal before amplifying the signal to keep input and output linear, and a plurality of feedback signals for distortion processing may be combined and transmitted through a single path. The communications devices (base station 110, wireless repeater 120, distributed antenna systems 130 and 140-n) including such a single feedback path will be described in more detail later below with reference to FIGS. 2 to 3.

Figure 2:
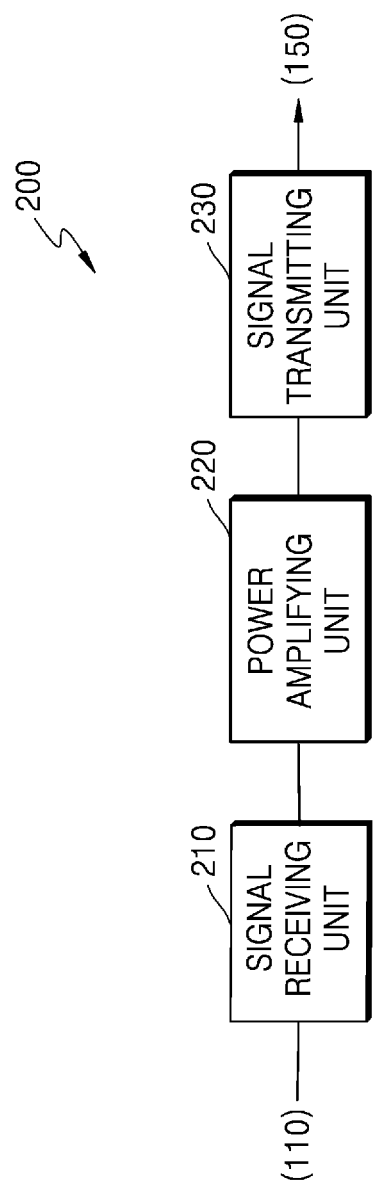
FIG. 2 is a configuration diagram of a communication device according to an embodiment of the present invention.

FIG. 2 is a configuration diagram of a communication device 200 according to an embodiment of the present invention.

The multi-path communication device 200 using a DPD power amplifier amplifies and relays a signal so as to smoothly communicate with the mobile communication terminal 150 (see FIG. 1) in the communication system 100 (see FIG. 1). For example, the multi-path communication device 200 using a DPD power amplifier may include the base station 110 (see FIG. 1), the wireless repeater 120 (see FIG. 1), and the distributed antenna systems 130 and 140-n (see FIG. 1). For convenience of explanation, FIG. 2 shows only components for transmitting a downlink signal received from the base station 110 (see FIG. 1) to the communication terminal 150 (see FIG. 1) in the wireless repeater 120 (see FIG. 1) and the distributed antenna systems 130 and 140-n. Components for transmitting an uplink signal of the mobile communication terminal 150 (see FIG. 1) to the base station 110 (see FIG. 1) may correspond to the configurations for transmitting the downlink signal, a detailed description of the components for transmitting the uplink signal will not be given herein.

Referring to FIG. 2, the communication device 200 may include a signal receiving unit 210, a power amplifying unit 220, and a signal transmitting unit 230.

The signal receiving unit 210 may receive a reception signal provided from the base station 110 (see FIG. 1) through a plurality of reception antennas of the wireless repeater 120 (see FIG. 1) or a reception port of the distributed antenna systems 130 and 140-n (see FIG. 1). The reception signal may include a downlink signal and a plurality of frequency band signals of the base station 110 (see FIG. 1), and may be transmitted to a multi-path through a plurality of reception antennas or a reception port.

The signal receiving unit 210 may be configured to transmit the reception signal to the multi-path to remove noise in each path, to perform frequency-down conversion and analog-to-digital conversion, and to output the converted signal. For example, the signal receiving unit 210 may include a low noise amplifier for amplifying the reception signal by minimizing noise, an intermediate frequency (IF) down converter for converting the reception signal amplified by the low noise amplifier from a signal of a radio frequency (RF) band into a signal of an intermediate frequency band, a frequency-down converter for converting the reception signal of the intermediate frequency band into a baseband signal, and an analog-to-digital converter (ADC) for converting the reception signal into a digital signal. Accordingly, the signal receiving unit 210 may perform signal processing for amplifying the reception signal in the power amplifying unit 220. Here, the frequency-down converter may be optionally omitted.

The power amplifying unit 220 receives a reception signal processed (e.g., noise removal, frequency-down conversion, and analog-to-digital conversion) by the signal receiving unit 210. The received signal may be pre-distorted and amplified based on a nonlinear characteristic of a power amplifier provided in the power amplifying unit 220 and output to the signal transmitting unit 230.

The signal transmitting unit 230 may select one band from a plurality of signals amplified by the power amplifying unit 220 and output the band as a single output signal. In addition, the signal transmitting unit 230 may remove noise of the output signal, perform frequency-up conversion, and transmit the signal to the terminal 150 (see FIG. 1). For example, the signal transmitting unit 230 may include a multiplexer for selecting one of a plurality of input signals and outputting a single output signal, a low noise amplifier for amplifying the output signal by minimizing noise, and a frequency-up-converter for up-converting the amplified signal into a signal of a radio frequency band. Accordingly, the signal transmitting unit 230 may transmit the signal of a radio frequency band to the terminal 150 (see FIG. 1) through a transmission antenna. Here, the frequency-up-converter may be optionally omitted.

The power amplifying unit 220 amplifies signals transmitted to respective paths in the multi-path communication device 200 using the DPD power amplifier by a power amplifier provided in each path and outputs the amplified signals to the signal transmitting unit 230. Also, the signals amplified in each path are partially extracted and fed back, and the extracted feedback signals may be combined to use a single feedback path. The power amplifying unit 220 using such a single feedback path will be described in more detail later below with reference to FIG. 3.

Figure 3:
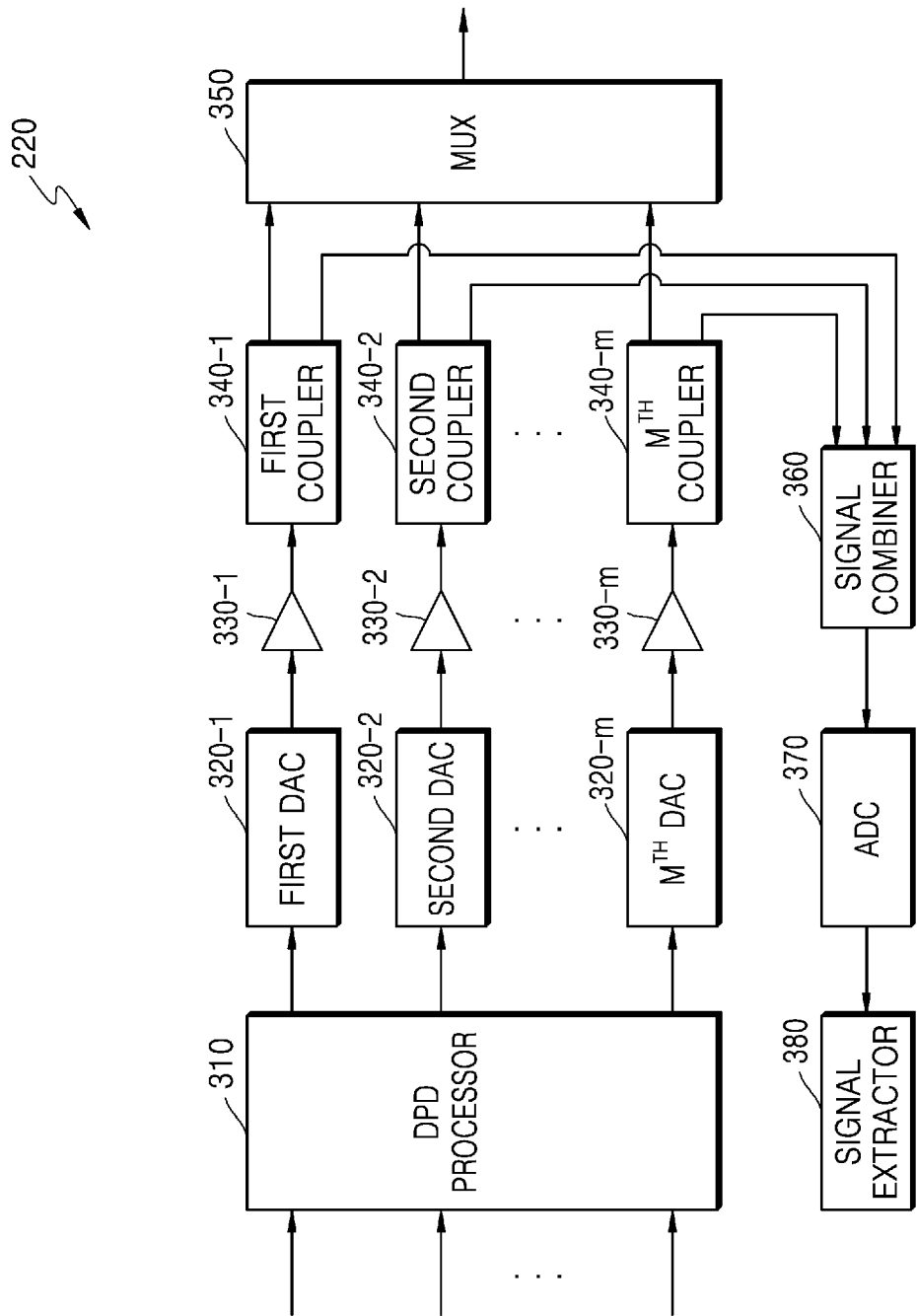
FIG. 3 is a configuration diagram of a power amplifying unit according to an embodiment of the present invention.

FIG. 3 is a configuration diagram of a power amplifying unit according to an embodiment of the present invention.

Referring to FIG. 3, the power amplifying unit 220 may include a DPD processor 310, first to mth digital-to-analog converters (DACs) 320-1, 320-2, . . . , and **320-*m* (where m is a natural number), first to mth power amplifiers 330-1, 330-2, . . . , 330-*m*, first to mth couplers 340-1, 340-2, . . . , 340-*m*, a multiplexer (MUX) 350, a signal combiner 360, an analog-to-digital converter (ADC) 370, and a signal extractor 380. The MUX 350 may be optionally included in the signal transmitting unit 230 (see FIG. 2**).

The DPD processor 310 pre-distorts each of a plurality of input signals output from the signal receiving unit 210 (see FIG. 2) based on nonlinear characteristics of the first to mth power amplifiers 330-1, 330-2, . . . , 330*m*, and outputs pre-distorted signals (hereinafter referred to as pre-distorted signals) to the first to mth DACs 320-1, 320-2, . . . , and **320-*m***.

The first to mth DACs 320-1, 320-2, . . . , and **320-*m* receive the first to mth pre-distorted signals from the DPD processor 310 through respective paths, convert the first to mth pre-distorted signals into first to mth analog signals, and output the first to mth analog signals to the first to mth power amplifiers 330-1, 330-2, . . . , 330***m* corresponding to the respective paths.

The first to mth power amplifiers 330-1, 330-2, . . . , 330*m* amplify the first to mth analog signals received from the first to mth DACs 320-1, 320-2, . . . , and **320-*m*, respectively, and output the amplified signals (hereinafter referred to as amplified signals) to the first to mth couplers 340-1, 340-2, . . . , 340-*m***, respectively.

The first to mth couplers 340-1, 340-2, . . . , **340-*m* receive first to mth amplified signals from the first to mth power amplifiers 330-1, 330-2, . . . , 330***m* to output the first to mth amplified signals to the MUX 35, and extract some of each of the first to mth amplified signals to output the extracted signals to the signal combiner 360 as feedback signals.

The MUX 350 receives first to mth amplified signals received from the first to mth couplers 340-1, 340-2, . . . , and **340-*m*** and outputs the mth amplified signal to a single line.

The signal combiner 360 receives some of the first to mth amplified signals extracted by the first to mth couplers 340-1, 340-2, . . . , **340-*m* from the first to mth couplers 340-1, 340-2, . . . , 340-*m*, as feedback signals. The signal combiner 360 combines some of the extracted first to mth amplified signals to one feedback signal (hereinafter referred to as a combined feedback signal) and outputs the combined feedback signal to the ADC 370**. In this case, a method of combining a plurality of feedback signals to one feedback signal may vary. It will be understood by one of ordinary skill in the art that the method of coupling signals cannot limit the scope of the present invention.

The ADC 370 receives a combined feedback signal from the signal combiner 360 through a single feedback path. The ADC 370 may convert the combined feedback signal into a digital signal and output the combined feedback signal to the signal extractor 380.

The signal extractor 380 receives the combined feedback signal from the ADC 370 and receives an mth control signal from the DPD processor 310. The signal extractor 380 may filter an mth feedback signal corresponding to the mth control signal from the combined feedback signal and output the mth feedback signal to the DPD processor 310. Furthermore, the signal extractor 380 may include a filter for filtering the mth feedback signal corresponding to the mth control signal from the combined feedback signal. A method of filtering the mth feedback signal corresponding to the mth control signal may vary. It will be understood by one of ordinary skill in the art that the method of filtering cannot limit the scope of the present invention.

According to an embodiment, the signal extractor 380 may extract a portion of a combined feedback signal, independently of a control signal of a DPD processor 310.

According to an embodiment, the signal extractor 380 may be a digital filter. For example, the signal extractor 380 implemented as a digital filter may extract a portion of a combined feedback signal by filtering only signals of some frequency bands from the combined feedback signal.

According to another embodiment, the signal extractor 380 may be implemented with some functions of a digital processor. For example, the signal extractor 380 implemented with some functions of the digital processor may select and extract a portion corresponding to a plurality of input signals in a frame of the combined feedback signal.

According to an embodiment, the signal extractor 380 may extract a combined feedback signal and output a feedback signal for input signals of at least two different frequency bands among a plurality of input signals. That is, the feedback signal extracted by the signal extractor 380 may include a feedback signal for input signals of at least two different frequency bands among a plurality of input signals.

Although a general operation procedure of the power amplifying unit 220 has been described above with reference to the configuration of the power amplifying unit 220 shown in FIG. 3, it goes without saying that the operation of the power amplifying unit 220 is not limited to that described above.

As an example, when an mth input signal is input, the DPD processor 310 generates the mth control signal for selecting the mth feedback signal and outputs the mth control signal to the signal extractor 380. The DPD processor 310 outputs the mth pre-distorted signal obtained by pre-distorting the mth input signal to the mth DAC **320-*m* using the mth feedback signal received from the signal extractor 380 in response to the mth control signal. For example, when a first input signal is input, the DPD processor 310 generates a first control signal for selecting a first feedback signal and outputs the first control signal to the signal extractor 380. The DPD processor 310 outputs the first pre-distorted signal to the first DAC 320-1 using the first feedback signal received from the signal extractor 380 in response to the first control signal. When the second input signal is input, the DPD processor 310 generates a second control signal for selecting a second input signal, and outputs the second control signal to the signal extractor 380. The DPD processor 310 outputs the second pre-distorted signal to the second DAC 320-2 using the second feedback signal received from the signal extractor 380** in response to the second control signal.

As such, the power amplifying unit 220 may reduce the size of a device and manufacturing cost thereof by sharing a feedback path between the DPD processor 310 and the plurality of power amplifiers 330-1, 330-2, . . . , **330-*m***.

Figure 4:
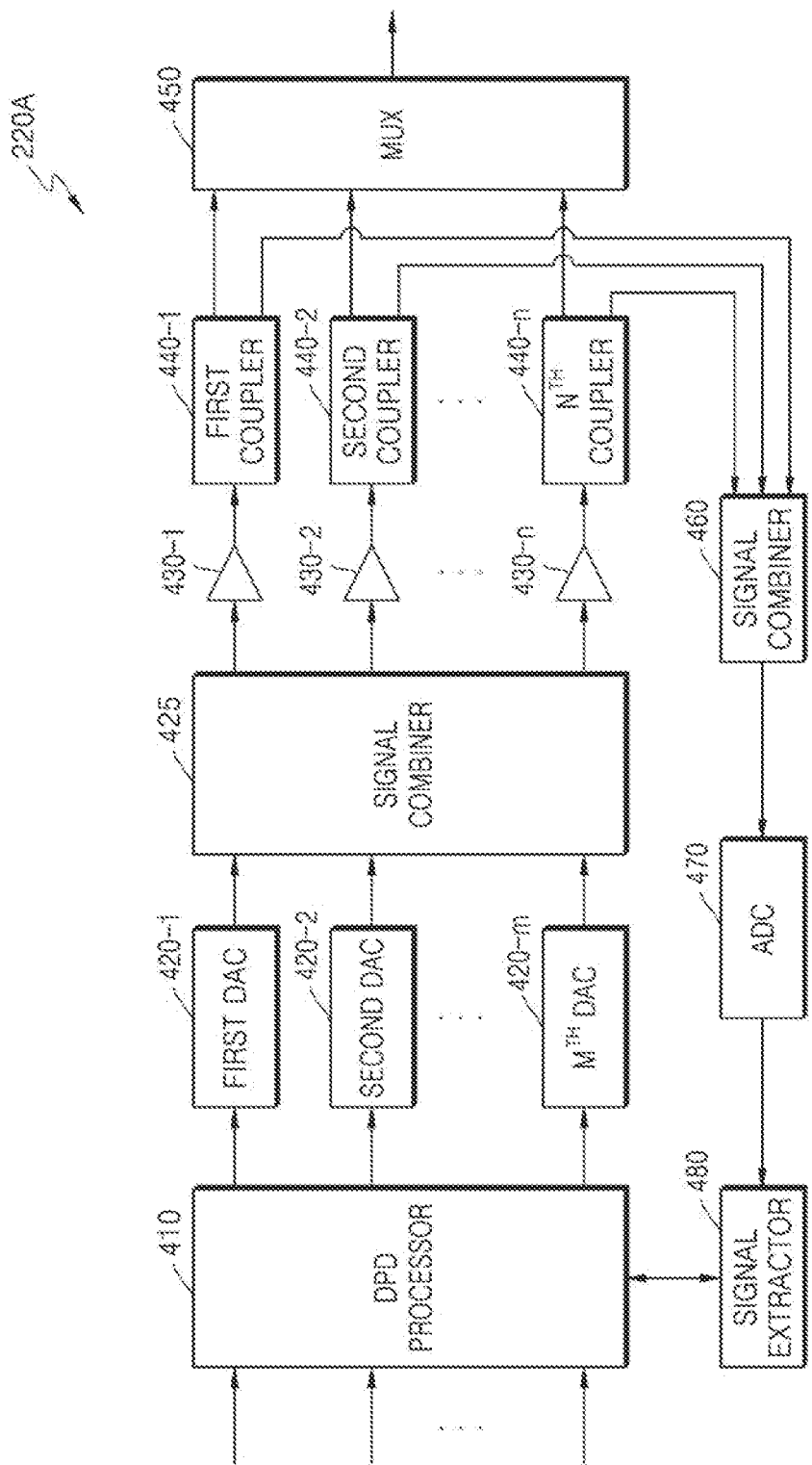
FIG. 4 is a configuration diagram of a power amplifying unit according to another embodiment of the present invention.

FIG. 4 is a configuration diagram of a power amplifying unit according to another embodiment.

Referring to FIG. 4, a power amplifying unit 220A according to another embodiment may further include a signal combiner 425 compared to the power amplifying unit 220 of FIG. 3, and the number of power amplifiers 430-1 to 430-n may be different from the number of a plurality of couplers 440-1 to 440-n. Other components 410, 420-1 to 420-m, 450, 460, 470, and 480 may operate substantially the same as the components 310, 320-1 to 320-m, 350, 360, 370, and 380 of the power amplifier 220 in FIG. 3.

The signal combiner 425 may combine and output at least some of a plurality of pre-distorted signals that are analog-converted and output from the plurality of digital-to-analog converters 420-1 to 420-m (where m is a natural number of 2 or more).

According to an embodiment, the signal combiner 425 may be implemented as an analog signal combiner. A method of combining a plurality of signals by the signal combiner 425 may be implemented in various forms. It will be understood by one of ordinary skill in the art that the method of combining signals cannot limit the scope of the disclosure.

According to an embodiment, the signal combiner 425 may output some of a plurality of pre-distorted signals that are analog-converted and output from the plurality of digital-to-analog converters 420-1 to 420-m (where m is a natural number of 2 or more), and may output the remaining without combining.

Each of the plurality of power amplifiers 430-1 to 430-n (where n is a natural number of 2 or more) may amplify each of a plurality of pre-distorted signals output by combining at least some of the plurality of pre-distorted signals from the signal combiner 425, and may output each of a plurality of amplified signals.

Each of the plurality of couplers 440-1 to 440-n may output each of feedback signals generated by coupling some of the plurality of amplified signals respectively output from the plurality of power amplifiers 430-1 to 430-n to the signal combiner 460.

According to an embodiment, the number of the plurality of power amplifiers 430-1 to 430-n and the number of the plurality of couplers 440-1 to 440-n may be equal to n.

According to an embodiment, the number of the plurality of power amplifiers 430-1 to 430-n may be less than the number of the plurality of digital-to-analog converters 420-1 to 420-m. That is, n may be less than m.

Figure 5:
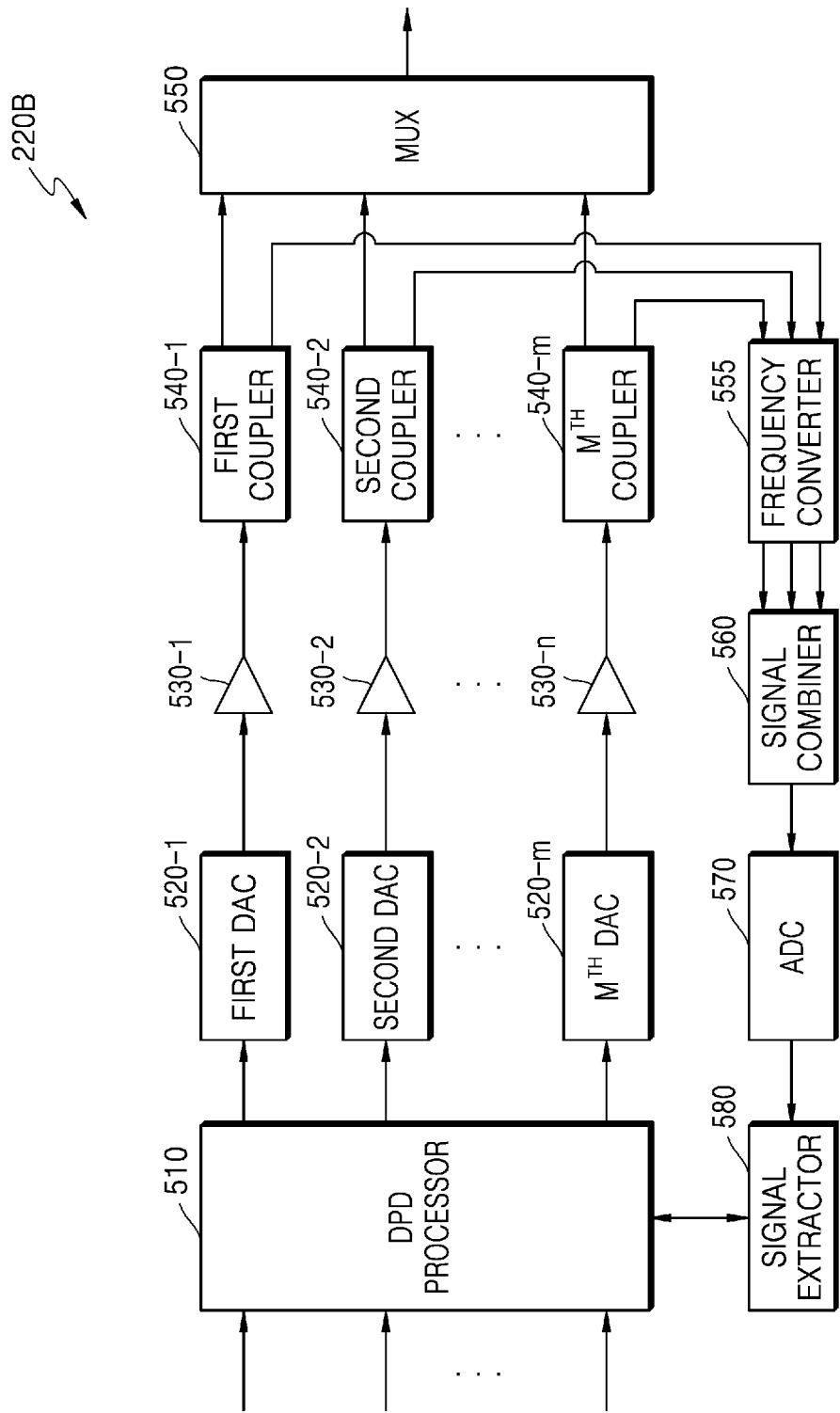
FIG. 5 is a configuration diagram of a power amplifying unit according to another embodiment of the present invention.

FIG. 5 is a configuration diagram of a power amplifying unit according to another embodiment.

Referring to FIG. 5, a power amplifying unit 220B according to another embodiment may further include a frequency converter 555 compared to the power amplifying unit 220 of FIG. 3. Other components 510, 520-1 to 520-m, 530-1 to 530-m, 540-1 to 540-m, 550, 560, 570, and 580 may operate substantially the same as the components 310, 320-1 to 320-m, 330-1 to 330-m, 340-1 to 340-m, 350, 360, 370, and 380 of the power amplifier 220 in FIG. 3.

The frequency converter 555 may convert and output frequencies of at least some of a plurality of feedback signals respectively output from the plurality of couplers 540-1 to 540-m and input to the signal combiner 560.

According to an embodiment, the frequency converter 555 may convert frequencies of at least some of a plurality of feedback signals such that respective frequency bands of the plurality of feedback signals do not overlap each other.

Because the frequency bands of the plurality of feedback signals frequency-converted by the frequency converter 555 do not overlap each other, smooth combining is possible in the signal combiner 560.

According to an embodiment, the frequency converter 555 may be included when the DPD processor 510 receives input signals of the same frequency band according to a time division duplex (TDD) scheme.

According to another embodiment, the frequency converter 555 may be selectively operated when the DPD processor 510 receives input signals of the same frequency band according to the TDD scheme.

According to another embodiment, the frequency converter 555 may be included in the power amplifying unit 220B, or may be selectively operated in the power amplifying unit 220B when input signals correspond to a frequency band that may interfere when combining signals even if frequencies of the input signals are not the same.

Figure 6:
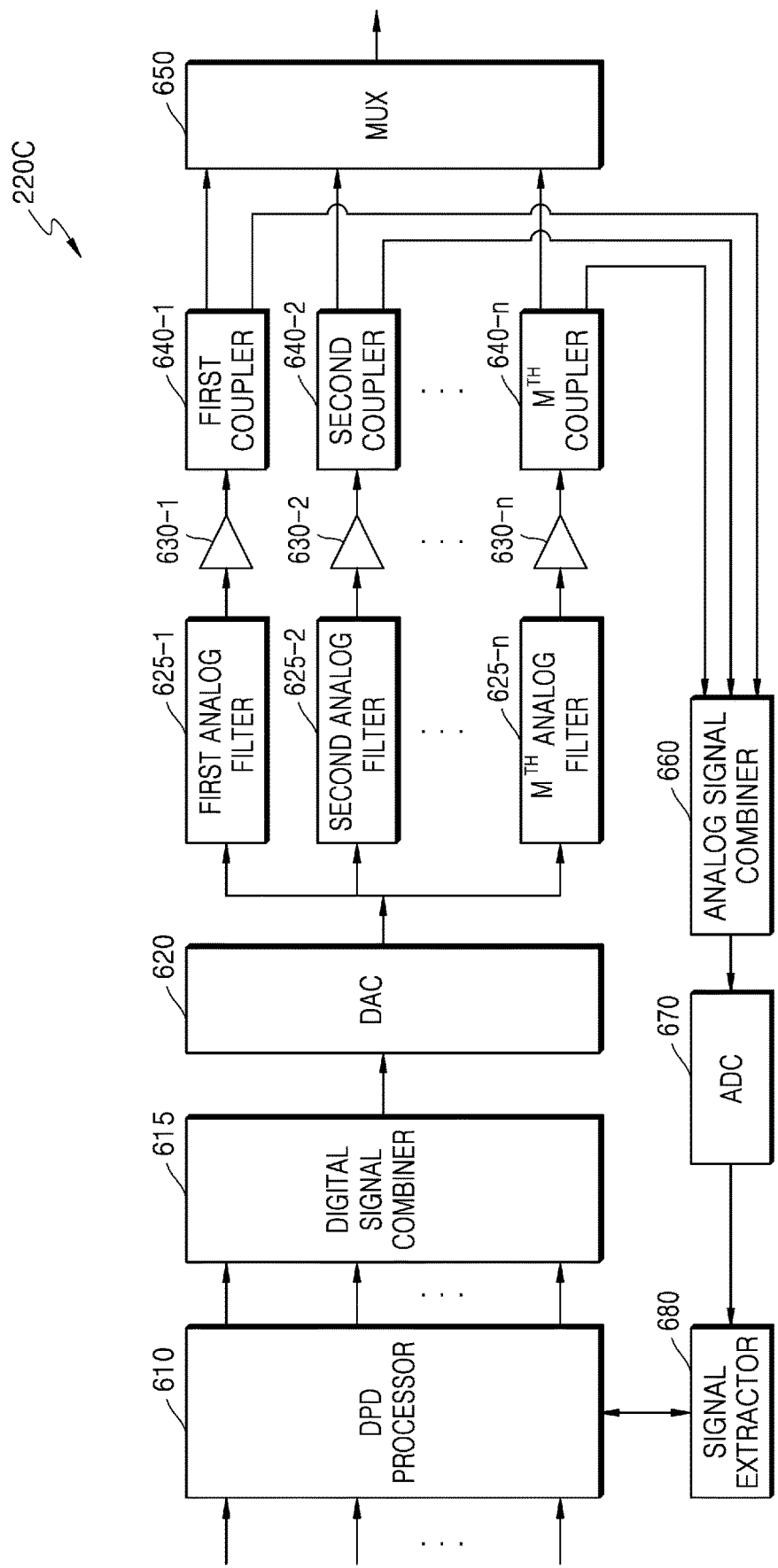
FIG. 6 is a configuration diagram of a power amplifying unit according to another embodiment of the present invention.

FIG. 6 is a configuration diagram of a power amplifying unit according to another embodiment.

Referring to FIG. 6, a power amplifying unit 220C according to another embodiment is different from the power amplifier 220 in FIG. 3 in that the power amplifying unit 220C includes a digital signal combiner 615, a single digital-to-analog converter 620, and a plurality of analog filters 625-1 to 625-n, and further includes power amplifiers 630-1 to 630-n that may be configured with a different number from the input signals and a plurality of couplers 640-1 to 640-n. In addition, components 610, 650, 660, 670, and 680 of the power amplifying unit 220C of FIG. 6 may operate substantially the same as the components 310, 350, 360, 370, and 380 of the power amplifier 220 in FIG. 3.

The digital signal combiner 615 may digitally combine and output a plurality of pre-distorted signals output from the DPD processor 610.

According to an embodiment, the digital signal combiner 615 may digitally sum a plurality of pre-distorted signals to output a digitally summed pre-distorted signal.

According to an embodiment, the digital signal combiner 615 may be implemented in a form that performs some functions of a digital processor (e.g., a field programmable gate array (FPGA), etc.).

The digital-to-analog converter 620 may convert the digitally summed pre-distorted signal by the digital signal combiner 615 into an analog signal and output the same.

The digital-to-analog converter 620 may transmit the analog-converted signal to each of the plurality of analog filters 625-1 to 625-n.

Each of the plurality of analog filters 625-1 to 625-n may receive an analog-converted signal and filter the received signal for each frequency band.

Each of the plurality of power amplifiers 630-1 to 630-n may amplify each of pre-distorted signals filtered for each frequency band by each of the plurality of analog filters 625-1 to 625-n and may output each of the amplified signals.

Each of the plurality of couplers 640-1 to 640-n may output an analog feedback signal generated by coupling a portion of each of the plurality of amplified signals respectively output from the plurality of power amplifiers 630-1 to 630-n to the analog signal combiner 660.

The analog signal combiner 660 may combine the plurality of analog feedback signals output from the plurality of couplers 640-1 to 640-n and output a combined feedback signal.

According to an embodiment, the power amplifier 220C may be implemented in a form that does not include the analog signal combiner 660.

in this case, the analog-to-digital converter 670 may directly receive at least one analog feedback signal (e.g., analog feedback signals generated by being coupled by the plurality of couplers 640-1 to 640-n) corresponding to a pre-distorted signal digital-combined and output by the DPD processor 610 and convert the at least one analog feedback signal into a digital signal, and may output a digital-converted feedback signal. Also, the signal extractor 680 may extract at least a portion of the digital-converted feedback signal and output the extracted feedback signal.

According to the disclosure, a feedback path may be shared through a single DPD feedback path in a multi-path communication device, thereby preventing an increase in the size of a device and manufacturing cost thereof caused by a plurality of DPD feedback paths.

In addition, according to an embodiment, a communication device may be implemented with only a small number of digital-to-analog converters compared to the number of input signals, so that an efficient structure may be obtained.

While the embodiments have been particularly shown and described, it will be understood by one of ordinary skill in the art that various changes in form and details may be made therein without departing from the spirit and scope of the present invention as defined by the appended claims.

What is claimed is:

1. A communication device comprising:
a DPD processor configured to output a plurality of pre-distorted signals by pre-distorting each of a plurality of input signals using an extracted feedback signal;
a first signal combiner configured to combine a plurality of feedback signals corresponding to the plurality of pre-distorted signals and output a combined feedback signal;
an analog-to-digital converter configured to convert the combined feedback signal into a digital signal and output a digital-converted combined feedback signal; and
a signal extractor configured to extract the digital-converted combined feedback signal and output the extracted feedback signal.

2. The communication device of claim 1, wherein the extracted feedback signal includes a feedback signal for input signals of at least two different frequency bands among the plurality of input signals.

3. The communication device of claim 1, wherein the signal extractor extracts the digital-converted combined feedback signal and outputs the extracted feedback signal to the DPD processor.

4. The communication device of claim 1, further comprising:
a plurality of digital-to-analog converters, each of which converts each of the plurality of pre-distorted signals output from the DPD processor into each of analog signals and outputs each of the analog signals.

5. The communication device of claim 4, further comprising:
a second signal combiner configured to combine and output at least some of the plurality of pre-distorted signals that are analog-converted and output from the plurality of digital-to-analog converters.

6. The communication device of claim 5, further comprising:
a plurality of power amplifiers, each of which amplifies each of a plurality of pre-distorted signals output by combining at least some of the plurality of pre-distorted signals from the second signal combiner and outputs each of a plurality of amplified signals.

7. The communication device of claim 6, further comprising:
a plurality of couplers, each of which outputs each of the plurality of feedback signals generated by coupling some of the plurality of amplified signals respectively output from the plurality of power amplifiers to the first signal combiner.

8. The communication device of claim 7, wherein a number of the plurality of power amplifiers is equal to a number of the plurality of couplers and less than a number of the plurality of digital-to-analog converters.

9. The communication device of claim 1, further comprising:
a frequency converter configured to convert frequencies of at least some of the plurality of feedback signals input to the first signal combiner.

10. The communication device of claim 9, wherein the frequency converter converts the frequencies of at least some of the plurality of feedback signals such that respective frequency bands of the plurality of feedback signals do not overlap each other.

11. A method of operating a communication device including a memory and a processor, the method comprising:
outputting a plurality of pre-distorted signals by pre-distorting each of a plurality of input signals using an extracted feedback signal;
combining a plurality of feedback signals corresponding to the plurality of pre-distorted signals and outputting a combined feedback signal;
converting the combined feedback signal into a digital signal and outputting a digital-converted combined feedback signal; and
extracting the digital-converted combined feedback signal and outputting the extracted feedback signal.

12. A communication device comprising:
a DPD processor configured to output a plurality of pre-distorted signals by pre-distorting each of a plurality of input signals using an extracted feedback signal;
a digital signal combiner configured to digital-combining the plurality of pre-distorted signals and outputting a digital-combined pre-distorted signal;
an analog-to-digital converter configured to convert at least one analog feedback signal corresponding to the digital-combined pre-distorted signal into a digital signal and output a digital-converted feedback signal; and
a signal extractor configured to extract at least a portion of the digital-converted feedback signal and output the extracted feedback signal.

13. The communication device of claim 12, further comprising:
an analog signal combiner configured to combine the analog feedback signals corresponding to the digital-combined pre-distorted signal and output a combined feedback signal, and
the analog-to-digital converter converts the combined feedback signal into the digital signal and outputs the digital-converted feedback signal.

14. The communication device of claim 12, wherein the digital signal combiner digitally sums the plurality of pre-distorted signals to output the digital-combined pre-distorted signal.

15. The communication device of claim 12, further comprising:
a digital-to-analog converter configured to convert the digital-combined pre-distorted signal into an analog signal and output the analog signal.

16. The communication device of claim 15, wherein the digital signal combiner is included in the digital-to-analog converter.

17. The communication device of claim 13, further comprising:
- a plurality of analog filters, each of which extracts a pre-distorted signal that is analog-converted and output from the digital-to-analog converter for each frequency band;
- a plurality of power amplifiers, each of which amplifies each of the pre-distorted signals extracted for each frequency band and outputs each of the amplified signals; and
- a plurality of couplers, each of which outputs an analog feedback signal corresponding to the pre-distorted signal generated by coupling a portion of each of the plurality of amplification signals to the analog signal combiner.

* * * * *